(12) United States Patent
Mukherjee et al.

(10) Patent No.: US 6,444,715 B1
(45) Date of Patent: Sep. 3, 2002

(54) LOW DIELECTRIC MATERIALS AND METHODS OF PRODUCING SAME

(75) Inventors: Shyama Mukherjee, Santa Clara; Roger Leung, San Jose; Kreisler Lau, Sunnyvale, all of CA (US)

(73) Assignee: Honeywell International Inc., Morristown, NJ (US)

( * ) Notice: Subject to any disclaimer, the term of this patent is extended or adjusted under 35 U.S.C. 154(b) by 3 days.

(21) Appl. No.: 09/587,851

(22) Filed: Jun. 6, 2000

(51) Int. Cl.$^7$ .................................................. C08J 9/28
(52) U.S. Cl. .................... 521/64; 521/154; 106/122; 428/331
(58) Field of Search ..................... 521/64, 154; 11/154; 106/122; 428/331

(56) References Cited

U.S. PATENT DOCUMENTS

| | | | |
|---|---|---|---|
| 3,371,053 A | * 2/1968 | Raskin | 521/78 |
| 5,458,709 A | 10/1995 | Kamezaki et al. | 156/89 |
| 5,504,042 A | * 4/1996 | Cho et al. | 437/247 |
| 5,593,526 A | 1/1997 | Yokouchi et al. | 156/89 |
| 5,776,990 A | 7/1998 | Hedrick et al. | 521/77 |
| 5,874,516 A | 2/1999 | Burgoyne, Jr. et al. | 528/219 |
| 5,922,299 A | * 7/1999 | Bruinsma et al. | 423/335 |
| 5,955,140 A | * 9/1999 | Smith et al. | 427/96 |
| 6,204,202 B1 | * 3/2001 | Leung et al. | 438/781 |

* cited by examiner

*Primary Examiner*—Morton Foelak
(74) *Attorney, Agent, or Firm*—Sandra P. Thompson; Robert D. Fish; Rutan & Tucker, LLP

(57) ABSTRACT

In accordance with the present invention, compositions and methods are provided in which the mechanical strength and durability of a precursor material having a plurality of pores is increased by a) providing a precursor material; b) treating the precursor material to form a nanoporous aerogel, preferably by using a supercritical drying process; c) providing a blending material having a reinforcing component and a volatile component; d) combining the nanoporous aerogel and the blending material to form an amalgamation layer; and e) treating the amalgamation layer to increase the mechanical strength of the layer by a substantial amount, and to ultimately form a low dielectric material that can be utilized in various applications.

12 Claims, 6 Drawing Sheets

$$\Delta P = \frac{2\gamma \cos\theta}{r}$$

$r = 0$ (zero)
DURING SUPERCRITICAL Extraction of fluids

LOW DIELECTRIC MATERIALS AND METHODS OF PRODUCING SAME

FIELD OF THE INVENTION

The field of the invention is low dielectric materials.

BACKGROUND

As the size of functional elements in integrated circuits decreases, complexity and interconnectivity increases. To accommodate the growing demand of interconnections in modern integrated circuits, on-chip interconnections have been developed. Such interconnections generally consist of multiple layers of metallic conductor lines embedded in a low dielectric constant material. The dielectric constant in such material has a very important influence on the performance of an integrated circuit. Materials having low dielectric constants (i.e., below 2.5) are desirable because they allow faster signal velocity and shorter cycle times. In general, low dielectric constant materials reduce capacitive effects in integrated circuits, which frequently leads to less cross talk between conductor lines, and allows for lower voltages to drive integrated circuits.

Low dielectric constant materials can be characterized as predominantly inorganic or organic. Inorganic oxides often have dielectric constants between 2.5 and 4, which tends to become problematic when device features in integrated circuits are smaller than 1 $\mu$m. Organic polymers include epoxy networks, cyanate ester resins, polyarylene ethers, and polyimides. Epoxy networks frequently show disadvantageously high dielectric constants at about 3.8–4.5. Cyanate ester resins have relatively low dielectric constants between approximately 2.5–3.7, but tend to be rather brittle, thereby limiting their utility. Polyimides and polyarylene ethers, have shown many advantageous properties including high thermal stability, ease of processing, low stress, low dielectric constant and high resistance, and such polymers are therefore frequently used as alternative low dielectric constant polymers.

With respect to other properties, desirable dielectrics should also be free from moisture and out-gassing problems, have suitable adhesive and gap-filling qualities, and have suitable dimensional stability towards thermal cycling, etching, and CMP processes (i.e., chemical, mechanical, polishing). Preferred dielectrics should also have Tg values (glass transition temperatures) of at least 300° C., and preferably 400° C. or more.

The demand for materials having dielectric constant lower than 2.5 has led to the development of dielectric materials with "designed-in nanoporosity". Since air has a dielectric constant of about 1.0, a major goal is to reduce the dielectric constant of nanoporous materials down towards a theoretical limit of 1. Several approaches are known in the art for fabricating nanoporous materials. In one approach, small hollow glass spheres are introduced into a material. Examples are given in U.S. Pat. No. 5,458,709 to Kamezaki and U.S. Pat. No. 5,593,526 to Yokouchi. However, the use of small, hollow glass spheres is typically limited to inorganic silicon-containing polymers.

In another approach, a thermostable polymer is blended with a thermolabile (thermally decomposable) polymer. The blended mixture is then crosslinked and the thermolabile portion thermolyzed. Examples are set forth in U.S. Pat. No. 5,776,990 to Hedrick et al. Alternatively, thermolabile blocks and thermostable blocks alternate in a single block copolymer, or thermostable blocks and thermostable blocks carrying thermolabile portions are mixed and polymerized to yield a copolymer. The copolymer is subsequently heated to thermolyze the thermolabile blocks. Dielectrics with k-values of 2.2, or less have been produced employing thermolabile portions. However, many difficulties are encountered utilizing mixtures of thermostable and thermolabile polymers. For example, in some cases distribution and pore size of the nanopores is difficult to control. In addition, the temperature difference between thermal decomposition of the thermolabile group and the glass transition temperature (Tg) of the dielectric is relatively low. Still further, an increase in the concentration of thermolabile portions in a dielectric generally results in a decrease in mechanical stability.

In yet another approach, a polymer is formed from a first solution in the presence of microdroplets of a second solution, where the second solution is essentially immiscible with the first solution. During polymerization, microdroplets are entrapped in the forming polymeric matrix. After polymerization, the microdroplets of the second solution are evaporated by heating the polymer to a temperature above the boiling point of the second solution, thereby leaving nanovoids in the polymer. However, generating nanovoids by evaporation of microdroplets suffers from several disadvantages. Evaporation of fluids from polymeric structures tends to be an incomplete process that may lead to undesired out-gassing, and potential retention of moisture. Furthermore, many solvents have a relatively high vapor pressure, and methods using such solvents therefore require additional heating or vacuum treatment to completely remove such solvents. Moreover, employing microdroplets to generate nanovoids often allows little control over pore size and pore distribution.

These problems are addressed in copending applications, Ser. Nos.: 60/128465; 60/128533; 60/128534; 60/128493 and 60/133218. In these applications, it is disclosed that nanoporous materials can be fabricated a) from polymers having backbones with reactive groups used in crosslinking; b) from polymer strands having backbones that are crosslinked using ring structures; and c) from stable, polymeric template strands having reactive groups that can be used for adding thermolabile groups or for crosslinking; d) by depositing cyclic oligomers on a substrate layer of the device, including the cyclic oligomers in a polymer, and crosslinking the polymer to form a crosslinked polymer; and e) by using a dissolvable phase to form a polymer.

Regardless of the approach used to introduce the pores, structural problems are frequently encountered in fabricating and processing nanoporous materials. In the case of a thin film, there is little relative surface area in which to form nanopores. Among other things, increasing the porosity beyond a critical extent (generally about 30% in the known structurally stable nanoporous materials) tends to cause the porous materials to be weak and in some cases to collapse. Collapse can be prevented to some degree by adding crosslinking additives that couple thermostable portions with other thermostable portions, thereby producing a more rigid network. However, even after cross-linking, the porous material can lose mechanical strength as the porosity increases, and the material will be unable to survive during integration of the dielectric film to a circuit.

The porous material can also be chemically weakened through exposure to a natural environment, which can induce reactions such as oxidation. The lack of chemical inertness can lead to a weaker material that has an increased dielectric constant, a shortened effective lifetime, and a likelihood of collapse.

Low dielectric materials may also be weakened during the formation of the pores or nanopores. Pores and nanopores are generally created in a low dielectric material when a portion of the low dielectric material is evaporated, thermalized, or replaced by a gas thus leaving a pore or cavity. As the pore forms, the surrounding material can collapse, either partially or fully, into the void being created because of the decrease in force against the surrounding material caused by the replacement of liquid with a gas. The collapse of the surrounding material can create several problems in the resulting lower dielectric material. First, many of the "designed-in nanopores" may be lost completely because of the collapse of the surrounding material into the forming pores. Second, the resulting low dielectric material may be weakened by small cracks and indentations caused by the surrounding material partially collapsing into the pores before, during, or after the curing or treating stage of the dielectric material.

Therefore, there is a need to provide methods and compositions to produce nanoporous low dielectric materials that combine increased porosity with increased durability and film strength.

SUMMARY OF THE INVENTION

In accordance with the present invention, compositions and methods are provided in which the dielectric constant of a blending material is decreased and the mechanical strength of the nanoporous aerogel is increased by a) providing a precursor material; b) treating the material to form a nanoporous aerogel, preferably by a supercritical drying process; c) providing a blending material having a reinforcing component and a volatile component; d) combining the nanoporous aerogel and the blending material to form an amalgamation layer; and e) treating the amalgamation layer to at least partially remove the volatile component, and to ultimately form a low dielectric material that is mechanically stable and that can be utilized in various applications.

Further, some desirable characteristics of the low dielectric material can include a) formation of spherical, or near spherical nanopores, b) sufficiently small pore size, c) a volume fraction of total pores preferably below 33%, and d) no or minimal pore interconnectivity.

Various objects, features, aspects and advantages of the present invention will become more apparent from the following detailed description of preferred embodiments of the invention, along with the accompanying drawings in which like numerals represent like components.

DETAILED DESCRIPTION

Figure 1:
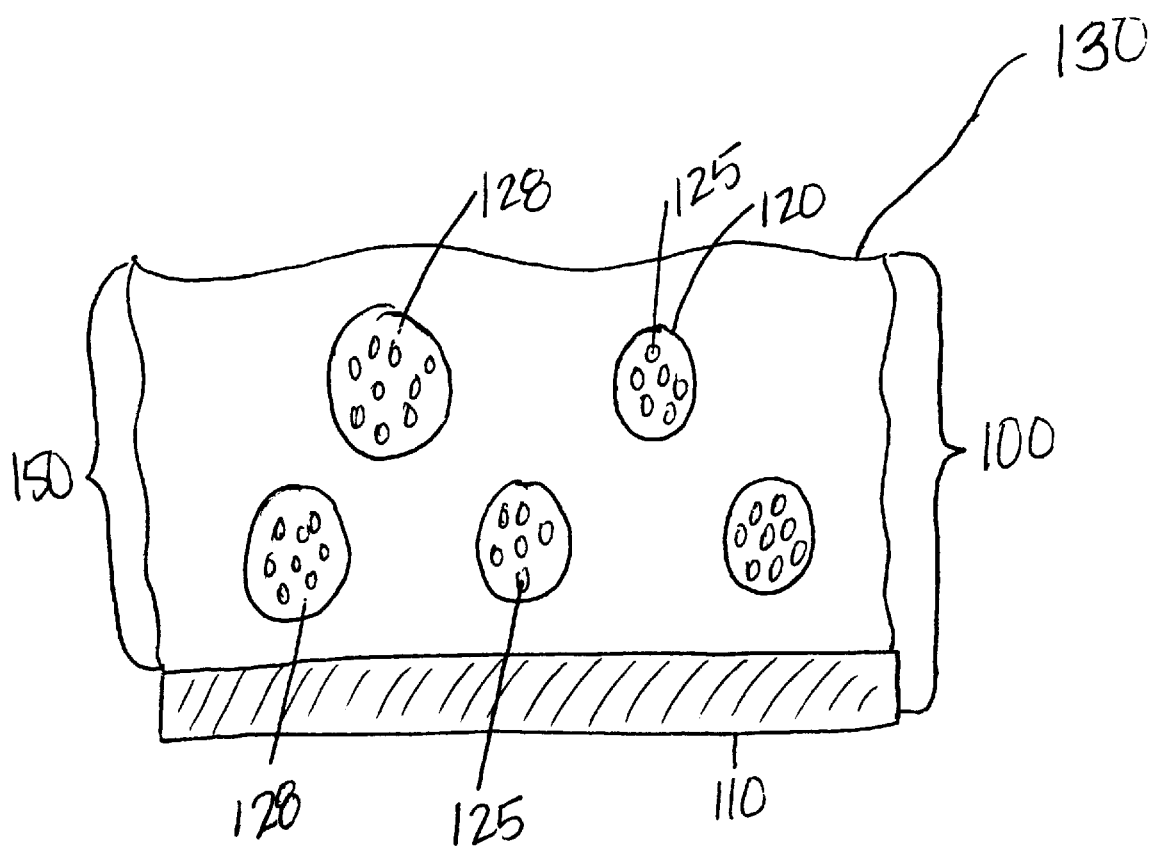
FIG. 1 is a cross-sectional view of a preferred embodiment of a low dielectric material.

In FIG. 1, described in detail below, a dielectric material 100 includes a substrate layer 110, a nanoporous aerogel 120, and a blending material 130 combined with the nanoporous aerogel 120 in an amalgamation layer 150. Before infiltration, the nanoporous aerogel 120 in a dielectric material 100 includes pores 125 and a support material 128. After infiltration, the nanoporous aerogel 120 in the dielectric material 100 includes pores 125, the support material 128 and the reinforcing component 136 of the blending material 130. The reinforcing component 136 is the blending material 130 after the volatile component 138 has been substantially removed.

Figure 2:
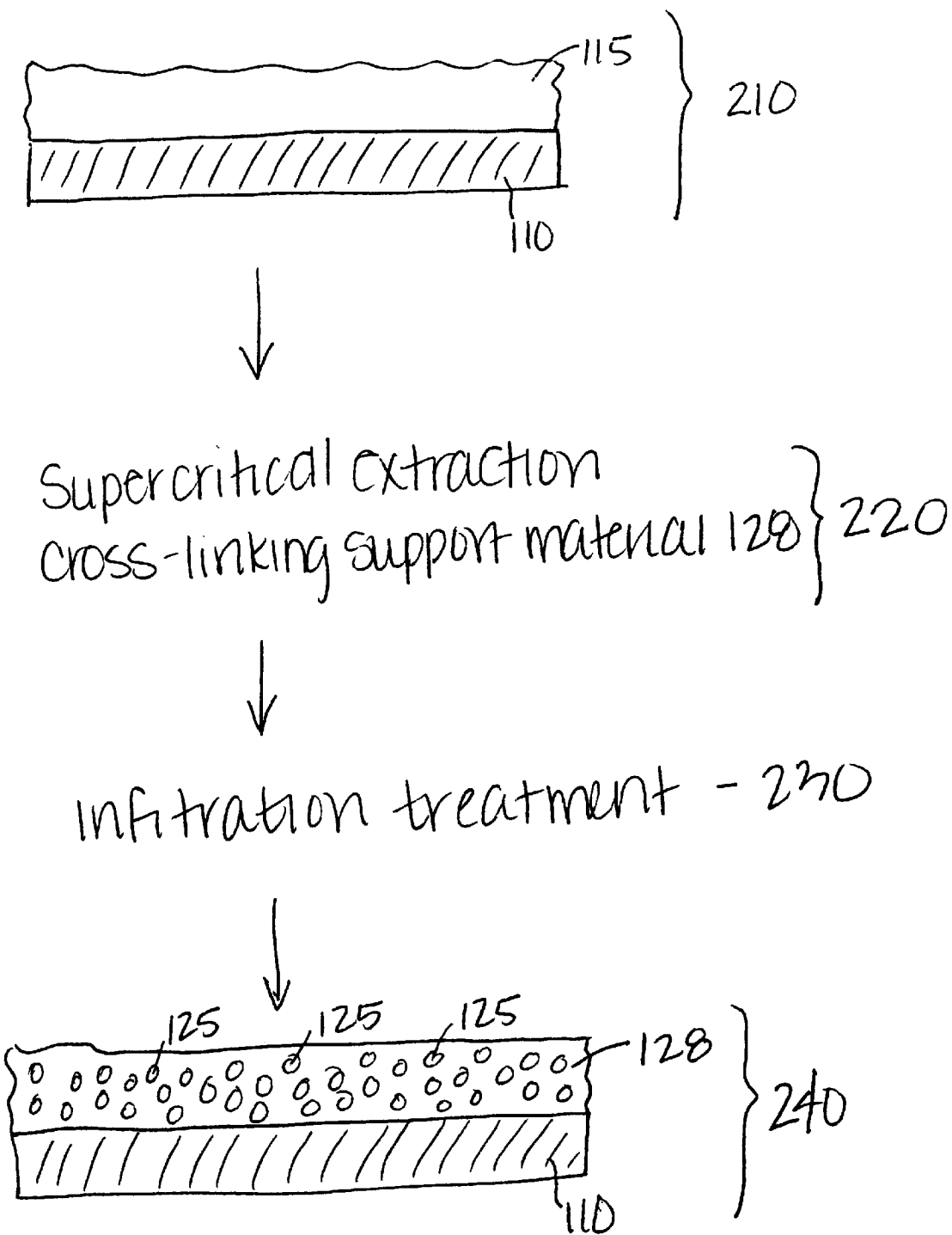
FIG. 2 is a method of producing a preferred low dielectric material.

In FIG. 2, described in detail below, a method of producing a preferred dielectric material 100 is shown. In step 210, a nanoporous aerogel precursor material 115 is deposited on a substrate layer 110, which is in this case a wafer. The nanoporous aerogel precursor material 115 is treated in step 220 by a) applying a supercritical extraction process and b) cross-linking the support material 128. The resulting support material 128 is further treated in step 230 by infiltrating or impregnating the resulting support material 128 to improve the strength of the material 128 and insure that the pore structure does not interconnect to form the dielectric material 100.

Figure 3:
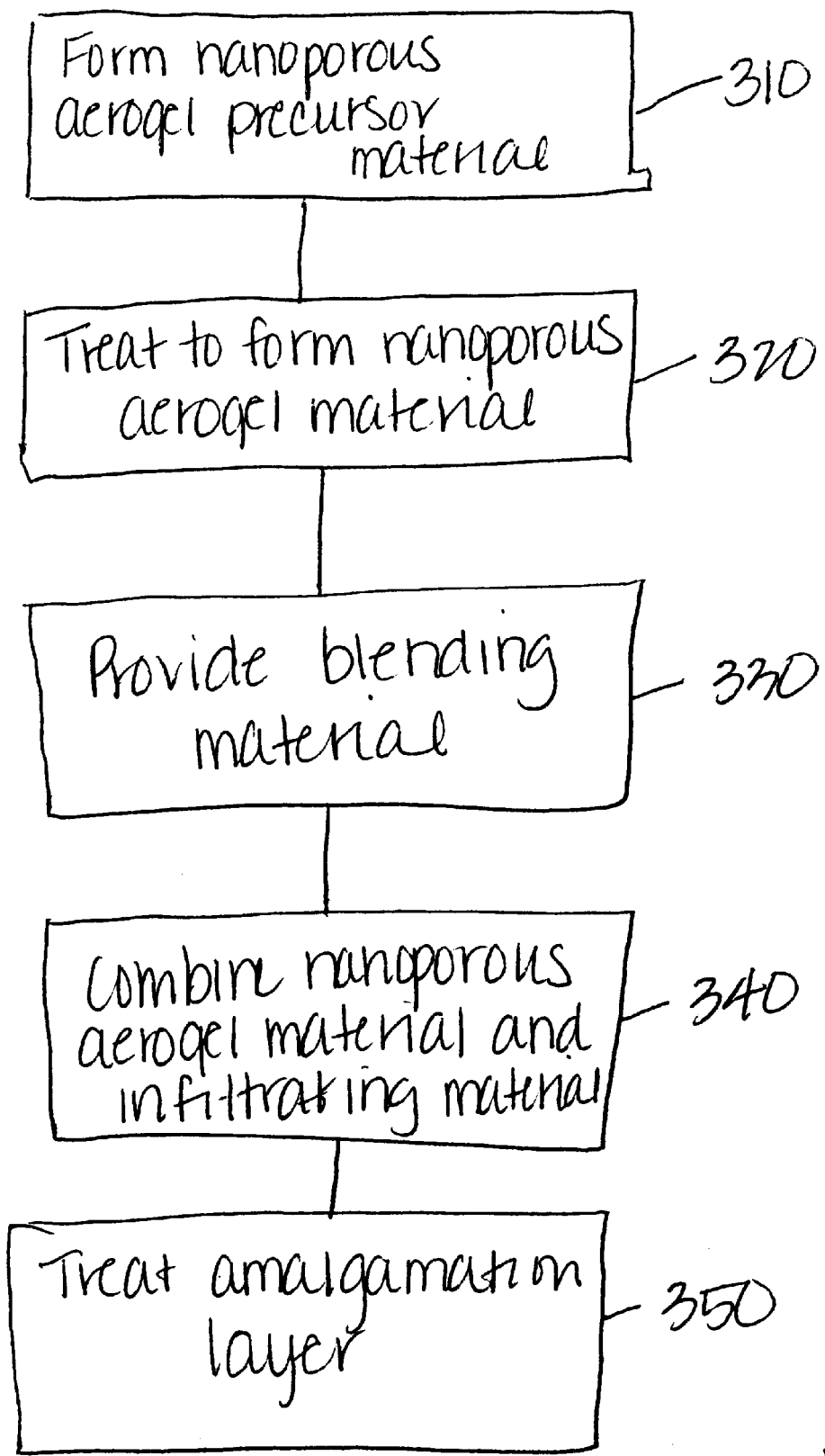
FIG. 3 is a flowchart of a preferred method for producing low dielectric materials.

In FIG. 3, described in greater detail below, a preferred method is provided in which the dielectric constant of a blending material is decreased and the mechanical strength of the nanoporous aerogel is increased by a) providing a precursor material 3 10; b) treating the precursor material to form a nanoporous aerogel 320; c) providing a blending material having a reinforcing component and a volatile component 330; d) combining the nanoporous aerogel and the blending material to form an amalgamation layer 340; and e) treating the amalgamation layer to at least partially remove the volatile component, and to ultimately form a low dielectric material that is mechanically stable and that can be utilized in various applications 350.

As used herein, the phrases "nanoporous aerogel precursor material" and "precursor material" are used interchangeably and mean a material that comprises an extraction component 126 and a support material 128. As used herein, the term "nanoporous aerogel" refers to the resultant material that is formed when an extraction component 126 of a support material 128 is replaced by a gas by some means in which the surface of the liquid does not significantly recede because of the pressure exerted by the support material 128. For example, if the extraction component 126 is consistently held under pressure greater than the vapor pressure, and the temperature is raised, the extraction component 126 will be transformed at the critical temperature into a "gas" or fluid (Supercritical Fluid or SCF) without two phases (liquid and gas) having been present at any time. S. S. Kistler, *J. Phys. Chem.* 34, 52, 1932.

The extraction component 126 of the nanoporous aerogel precursor material 115 may comprise any suitable pure or mixture of organic, organometallic or inorganic molecules that are volatilized at a desired temperature, such as the critical temperature. The extraction component 126 may also comprise any suitable pure or mixture of polar and non-polar compounds. In preferred embodiments, the extraction component 126 comprises water, ethanol, propanol, acetone, ethylene oxide, benzene, toluene, ethers, cyclohexanone and anisole. In more preferred embodiments, the extraction component 126 comprises anisole, toluene, cyclohexanone, ethers and acetone, with cyclohexanone and anisole being most preferred. As used herein, the term "pure" means that component that has a single chemical species. For example, pure water is composed solely of $H_2O$. As used herein, the term "mixture" means that component that is not pure, including salt water. As used herein, the term "polar" means that characteristic of a molecule or compound that creates an unequal charge distribution at one point of or along the molecule or compound. As used herein, the term "non-polar" means that characteristic of a molecule or compound that creates an equal charge distribution at one point of or along the molecule or compound.

The extraction component 126 may comprise any appropriate percentage of the precursor material 115 that would provide a desirable viscosity of the support material 128 and the extraction component 126, and further provide a means of controlling the amount of the support material 128 to be incorporated in the nanoporous aerogel precursor material 115. In preferred embodiments, the extraction component 126 comprises that part of the nanoporous aerogel precursor material 115 that is slightly more than is necessary to solvate the support material 128. In more preferred embodiments, the extraction component 126 comprises that part of the nanoporous aerogel precursor material 115 that is necessary to solvate the support material 128. It is contemplated that the extraction component 126 comprises more than 80 wt. % of the nanoporous aerogel precursor material 115. It is further contemplated that the extraction component 126 comprises more than 90 wt. % of the nanoporous aerogel precursor material 115.

The support material 128 of the nanoporous aerogel precursor material 115 and subsequently the nanoporous aerogel 120, as shown in FIG. 1, can be composed of organic, inorganic or organometallic compounds, or any suitable combination of organic, inorganic, and/or organometallic compounds, depending on the desired consistency and mechanical properties of the nanoporous aerogel 120 and the dielectric material 100. Examples of contemplated organic compounds are polyethers, polyimides, thermoset aromatics or polyesters. Examples of contemplated inorganic compounds include silica or aluminosilicates as well as ceramic materials. Examples of contemplated organometallic compounds include poly(dimethylsiloxane), poly(vinylsiloxane) and poly(trifluoropropylsiloxane). The support material 128 may also include both polymers and monomers depending on the mechanical properties and consistency desired. The support material 128 may be composed of amorphous, cross-linked, crystalline, or branched polymers. Preferred components of the support material 128 are organic polymers and hybrid organic-inorganic polymers. More preferred components of the support material 128 are organic, cross-linked polymers and organic-silica blends. Even more preferred components of the support material 128 are FLARE™ polymers, which are a class of poly(arylene) ethers, and FLARE™ polymers blended with silica precursors.

As used herein, the term "crosslinking" refers to a process in which at least two molecules, or two portions of a long molecule, are joined together by a chemical interaction. Such interactions may occur in many different ways including formation of a covalent bond, formation of hydrogen bonds, hydrophobic, hydrophilic, ionic or electrostatic interaction. Furthermore, molecular interaction may also be characterized by an at least temporary physical connection between a molecule and itself or between two or more molecules.

As used herein, the phrase "dielectric constant" means a dielectric constant of 1 MHz to 2 GHz, unless otherwise inconsistent with context. It is contemplated that the dielectric constant of the dielectric material 100 is less than 3.0. In preferred embodiments, the value of the dielectric constant is less than 2.5. In a more preferred embodiment, the value of the dielectric constant is less than 2.0. As used herein, the phrases "low dielectric" or "low dielectric material" are used interchangeably and mean a dielectric material that has a dielectric constant below 3.0.

As used herein, the word "pore" means a "void" in a material, i.e. the physical result of a particular amount of solid or liquid material being replaced with a gas. The composition of the gas is generally not critical, and appropriate gases include relatively pure gases and mixtures thereof, including air. The nanoporous aerogel 120 may comprise a plurality of pores 125. Pores 125 may have any suitable shape. Pores 125 are typically spherical, but may alternatively or additionally have tubular, lamellar, discoidal, or other shapes. Pores 125 may have any appropriate sphere equivalent mean diameter, and may have some connections with adjacent pores 125 to create a structure with a significant amount of connected or "open" porosity. As used herein, the term "sphere equivalent mean diameter" means that diameter that can be calculated by 1) taking the volume required to fill up a pore, 2) using that volume to approximate a sphere, and 3) determining the diameter from that sphere. In preferred embodiments, pores 125 have a mean diameter of less than 1 micrometer. In more preferred embodiments, pores 125 have a mean diameter of less than 100 nanometers. And in still more preferred embodiments, pores 125 have a mean diameter of less than 10 nanometers. Pores 125 may be uniformly or randomly dispersed within the nanoporous aerogel 120. In preferred embodiments, pores 125 are uniformly dispersed within the nanoporous aerogel 120.

Figure 4:
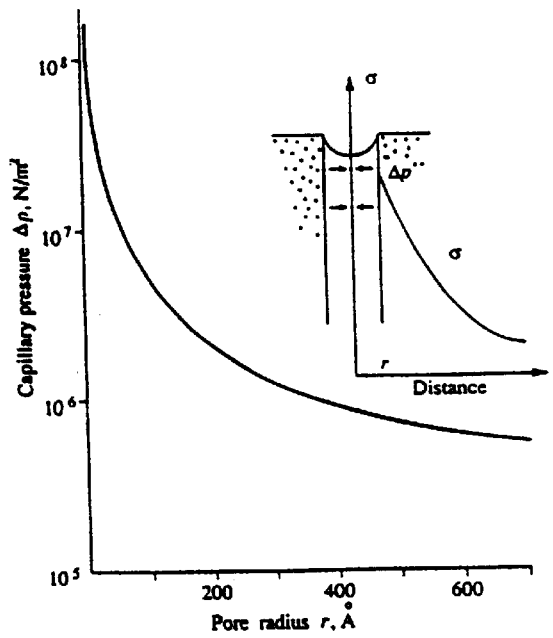
FIG. 4 is a graph showing the typical capillary pressure that can be expected during a conventional drying process as the pore radius decreases.
Figure 5:
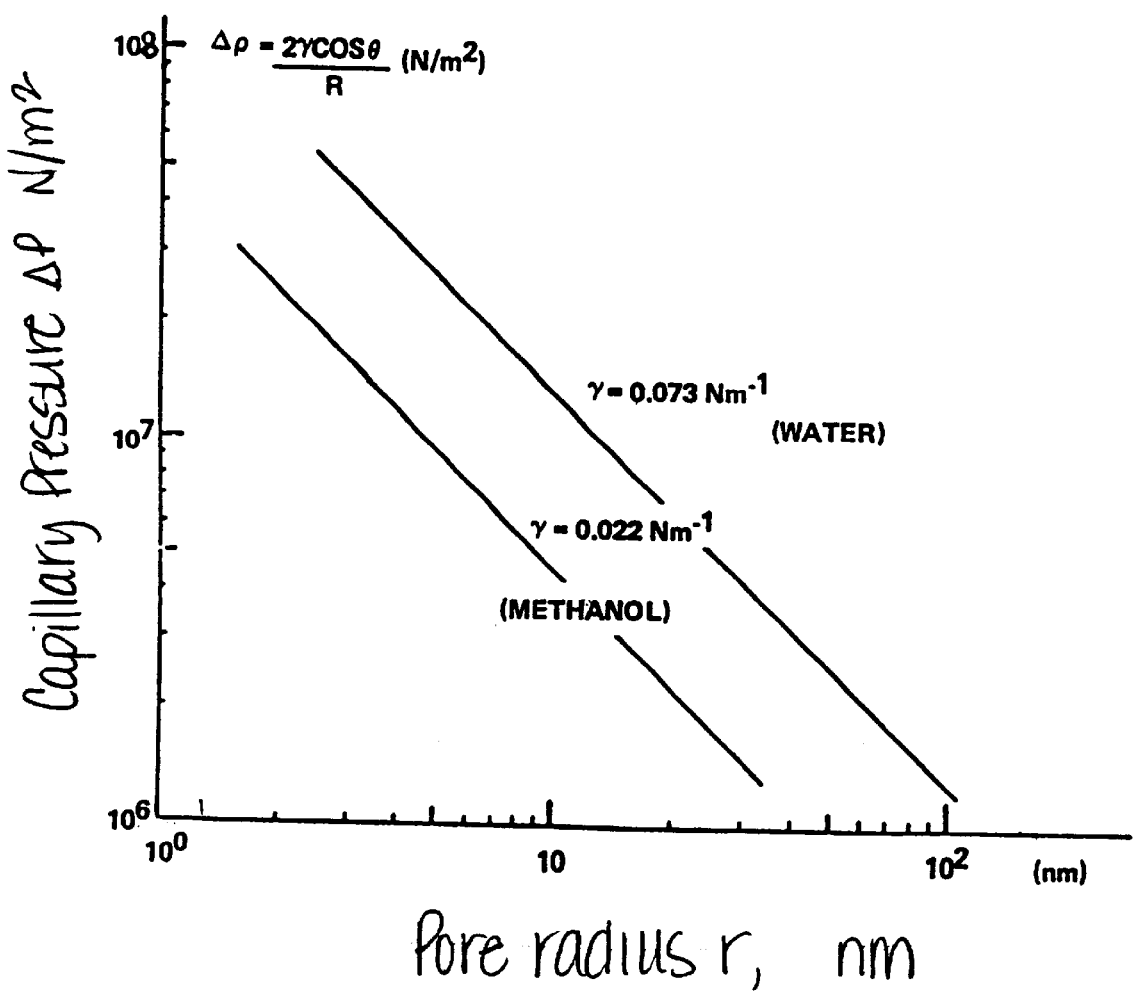
FIG. 5 is a graph showing another typical capillary pressure that can be expected during a conventional drying process as the pore radius decreases.

The nanoporous aerogel precursor material 115 can be converted into nanoporous aerogel 120 through a treating process. An appropriate treating process is one that reduces or eliminates the drying stress or capillary pressure of the nanoporous aerogel precursor material 115 while continuing to maintain a suitable or desirable degree of nanoscale porosity. FIGS. 4 and 5 show the typical capillary pressure that can be expected during a conventional drying process as the pore radius decreases. FIG. 4 is taken from Zarzycki, J., "Monolithic Xero and Aerogels for Gel-Glass Processes" in *Ultrastructure Processing of Ceramics, Glasses, and Composites*. John Wiley (New York) p. 27–42. 1984. FIG. 5 is taken from Zarzycki, J., "Sol-Gel Preparative Methods" in *Glass–Current Issues*. Edited by A. F. Wright and J. Dupay, Martinus Nijhoff Publishing (Boston). 1985. In preferred embodiments, the treating process involves extracting the extraction component 126. In more preferred embodiments, the treating process involves supercritical drying of the nanoporous aerogel precursor material 115.

As used herein, the phrases "supercritical drying", "supercritical drying process", "supercritical extraction" or "supercritical extraction process" are used interchangeably and mean a process whereby the extraction component 126 is extracted or removed above the critical temperature ($T_c$) and critical pressure ($P_c$) of the extraction component 126. As used herein, the terms "supercritical drying", "supercritical drying process", "critical temperature", "critical pressure", "vapor", and "gas" are used in a highly technical sense. As used herein, the phrase "critical temperature" means that temperature above which vapor cannot be liquefied, no matter what pressure is applied. As used herein, the phrase "critical pressure" means that minimum pressure required to produce liquefaction of a substance at the critical temperature. As used herein, the terms "liquefied" and "liquefaction" means the transformation of a gas into a liquid, and can be used interchangeably. As used herein, the term "gas" means a fluid form of matter that is at a temperature higher than its critical temperature. As used herein, the term "vapor" means a gaseous form of matter at a temperature below its critical temperature. As used herein, the term "vaporized" means the process of converting a particular state of matter into a vapor, and the term "volatilized" mean the process of converting a particular state of matter into a gas.

The nanoporous aerogel 120 may comprise the support material 128 or a combination of the support material 128 and the extraction component 126. In preferred embodiments, the nanoporous aerogel 120 comprises the support material 128 and a significantly smaller concentration of the extraction component 126 relatively. In a more preferred embodiment, the nanoporous aerogel 120 comprises essentially the support material 128.

The nanoporous aerogel 120 may comprise any suitable phase or composition of matter, including powder, gel or film. In preferred embodiments, the nanoporous aerogel 120 comprises a powder or a film, with a powder being the most preferred embodiment.

The nanoporous aerogel 120 may be further heated after the supercritical temperature extraction process to create a cross-linked network of nanoporous aerogel 120. In preferred embodiments, the additional heating step occurs when the nanoporous aerogel 120 is in a powder or film phase. In more preferred embodiments, the additional heating step occurs when the nanoporous aerogel 120 is in a powder phase.

The blending material 130 comprises a reinforcing component 136 and a volatile component 138. The reinforcing component 136 may comprise any suitable pure or mixture of organic, organometallic or inorganic molecules, any of which may or may not comprise a polymer. Examples of contemplated bonding compounds are polyethers, polyimides, thermoset aromatics, polyesters, and related ions, radicals, excited neutrals, and reactive compounds. Examples of contemplated inorganic compounds include silica or aluminosilicates as well as ceramic materials, and related ions, radicals, excited neutrals, and reactive compounds. Examples of contemplated organometallic compounds include poly(dimethylsiloxane), poly(vinylsiloxane) and poly(trifluoropropylsiloxane), and related ions, radicals, excited neutrals, and reactive compounds. The reinforcing component 136 may also include both polymers and monomers depending on the mechanical properties and consistency desired. It is further contemplated that the reinforcing component 136 may be composed of amorphous, cross-linked, crystalline, or branched polymers. Preferred components of the reinforcing component 136 are organic polymers or organic/inorganic hybrid compounds. More preferred components of the reinforcing component 136 are organic, cross-linked polymers. Even more preferred components of the reinforcing component 136 are FLARE™ polymers.

The reinforcing component 136 may additionally or alternately comprise monomers. As used herein, the term "monomer" refers to any chemical compound that is capable of forming a covalent bond with itself or a chemically different compound in a repetitive manner. The repetitive bond formation between monomers may lead to a linear, branched, super-branched, or three-dimensional product. Furthermore, monomers may themselves comprise repetitive building blocks, and when polymerized the polymers formed from such monomers are then termed "block polymers" or "block co-polymers", depending on the desired consistency of the reinforcing component 136. Monomers may belong to various chemical classes of molecules including organic, organometallic or inorganic molecules. Examples of contemplated organic monomers are acrylamide, vinylchloride, fluorene bisphenol or 3,3'-dihydroxytolane. Examples of contemplated organometallic monomers are octamethylcyclotetrasiloxane, methylphenylcyclotetrasiloxane, hexanethyldisilazane, and triethyoxysilane. Examples of contemplated inorganic monomers include tetraethoxysilane or aluminum isopropoxide. The molecular weight of monomers may vary greatly between about 40 Dalton and 20000 Dalton. However, especially when monomers comprise repetitive building blocks, monomers may have even higher molecular weights. Monomers may also include additional groups, such as groups used for crosslinking.

In further alternative embodiments, many silicon-containing materials including than colloidal silica are contemplated as components of the reinforcing component 136, including fumed silica, siloxanes, silsequioxanes, and sol-gel-derived monosize silica. Appropriate silicon-containing compounds preferably have a size of below 100 nm, more preferably below 10 nm and most preferably below 5 nm. The reinforcing component 136 may also comprise materials other than silicon-containing materials, including organic, organometallic or partially-inorganic materials. For example, appropriate organic materials are polystyrene, and polyvinyl chloride. Contemplated organometallic materials are, for example, octamethylcyclotetrasiloxane. Contemplated inorganic materials are, for example, $KNO_3$.

The blending material 130 also comprises a volatile component 138. The volatile component 138 may comprise any suitable pure or mixture of polar and non-polar compounds. In preferred embodiments, the volatile component 138 comprises water, ethanol, propanol, acetone, ethylene oxide, benzene, toluene, ethers, cyclohexanone and anisole. In more preferred embodiments, the volatile component 138 comprises anisole, toluene, cyclohexanone, ethers and acetone, with cyclohexanone and anisole being the most preferred embodiments.

The blending material 130 can be introduced into at least some of the plurality of pores 125 found in the nanoporous aerogel 120 by any suitable method to form an amalgamation layer 150. It is contemplated that suitable methods of introducing the blending material 130 onto the nanoporous aerogel 120 include spinning the blending material 130 onto the nanoporous aerogel 120, rolling the blending material 130 onto the nanoporous aerogel 120, dripping or pouring the blending material 130 onto the nanoporous aerogel 120, and mixing the blending material 130 with the nanoporous aerogel 120. Suitable methods of introducing the blending material 130 into at least some of voids 125 include gravity precipitation, applying force or pressure to the nanoporous aerogel 120, or shaking or otherwise moving the nanoporous aerogel 120. In a preferred embodiment, the blending material 130 is introduced to the nanoporous aerogel 120 by mixing to form the amalgamation layer 150, and the blending material 130 is introduced into some of voids 125 by gravity precipitation.

Any excess of the blending material 130 can then be optionally, partially, or completely removed from the amalgamation layer 150 by any suitable removal apparatus or methods. The removal of the blending material can include spinning off excess blending material 130, or rinsing off excess blending material 130 with an appropriate solvent. Suitable solvents may include cyclohexanone, anisole, toluene, ether or mixtures of compatible solvents. It is contemplated that there may be no excess blending material 130, and thus, there will be no need for a blending material removal step. It is even further contemplated that the blending material 130 may itself be used to rinse the top surface of the amalgamation layer 150. It is also contemplated that the ratio of the volatile component 138 to the reinforcing component 136 may be increased in the rinse material. As used herein, the phrase "any excess" does not suggest or imply that there is necessarily any excess blending material 130.

The volatile component 138 can be removed from the blending material 130 by any suitable removal procedure, including heat and/or pressure, after formation of the amalgamation layer 150. In preferred embodiments, the volatile component 138 can be removed by heating the blending material 130, the amalgamation layer 150 or the dielectric material 100. In more preferred embodiments, the volatile component 138 is removed by heating the blending material 130, the amalgamation layer 150 or the dielectric material 100 in a gaseous environment at atmospheric pressure. In other preferred embodiments, the volatile component 138 is removed by heating the blending material 130, the amalgamation layer 150 or the dielectric material 100 in a gaseous environment at sub-atmospheric pressure. As used herein, the phrase "sub-atmospheric pressure" means that pressure that has a value lower than 1 mm Hg (one millimeter of mercury). As used herein, the phrase "atmospheric pressure" means that pressure that has a value of 760 mm Hg. As used herein, the phrase "gaseous environment" means that environment that contains pure gases, including nitrogen, helium, or argon; or mixed gases, including air.

The blending material 130 may have a dielectric constant that is significantly different from that of the nanoporous aerogel 120. In preferred embodiments, the blending material 130 will have a dielectric constant in a range of 2.8–3.0, and the nanoporous aerogel 120 will have a dielectric constant in the range of 1.1–2.0. For example, different types of materials, such as aerogels, TEFLON™, polyimides, or quartz, may lead to different overall dielectric constant depending on the material chosen by the user.

It is contemplated that the dielectric constant of the amalgamation layer 150 and subsequently the dielectric material 100 can be influenced or altered based on the various combinations of blending materials 130 and nanoporous aerogels 140. In preferred embodiments, the dielectric constant of the amalgamation layer 150 and subsequently the dielectric material 100 can be lowered by adding various concentrations of nanoporous aerogels 140 that have been designed and produced to complement the blending materials 130 provided.

The amalgamation layer 150 can be deposited onto a substrate layer 110 by any suitable method. Contemplated methods include spinning the amalgamation layer 150 onto the substrate layer 110, rolling the amalgamation layer 150 onto the substrate layer 110, dripping the amalgamation layer 150 onto the substrate layer 110, or pouring the amalgamation layer 150 onto the substrate layer 110. In preferred embodiments, the amalgamation layer 150 is rolled or spun onto the substrate layer 110. It is contemplated that the amalgamation layer 150 can be deposited in any suitably sized or shaped deposit. Especially contemplated depositions are thin-film type deposits (<1 mm); however, other depositions including thick-film ($\geq$1 mm), or stand-alone deposits are also contemplated.

The substrate layer 110 may comprise any desirable substantially solid material. Particularly desirable substrate layers would comprise films, glass, plastic, coated metal, or composite material. In preferred embodiments, the substrate layer 110 comprises a silicon wafer or germanium arsenide, with a silicon wafer being the most preferred embodiment.

The dielectric material 100 can be cured to its final form before or after any excess blending material 130 is removed from the amalgamation layer 150 or the dielectric material 100. Although in preferred embodiments the amalgamation layer 150 is cured into the dielectric material 100 using heat (for example: a) curing in an oven at 130° C. for 2 hours, b) baking on hot plates at 150/200/250° C. for one minute each and curing at 400° C. for 60 minutes, or c) baking to 150° C., 200° C. and 250° C. for one minute each and cured at 400° C. for 1 hour in flowing nitrogen) many other methods are contemplated, including catalyzed and uncatalyzed methods. Catalyzed methods may include general acid- and base catalysis, radical catalysis, cationic- and anionic catalysis, and photocatalysis. For example, a polymeric structure may be formed by UV-irradiation, addition of radical starters, such as ammoniumpersulfate, and addition of acid or base. Uncatalyzed methods include application of pressure, or application of heat at subatmospheric, atmospheric or superatmospheric pressure.

In preferred embodiments, the dielectric material 100 can be "capped" by the introduction of an additional blending material 130 as part of the treating or curing stage of the assembly of the amalgamation layer 150 or the subsequent dielectric material 100. It is contemplated that the reinforcing component 136 of the additional blending material 130 will react or otherwise form a covalent or ionic bond with the low dielectric material. It is further contemplated that after the reaction between the amalgamation layer 150 or the dielectric material 100 and the reinforcing component 136 of the additional blending material 130, the dielectric material 100 or the amalgamation layer 150 will be able to withstand an oxygenated environment without chemical breakdown or loss of mechanical strength of the dielectric material 100 or the amalgamation layer 150.

The mechanical strength of the final low dielectric material can be determined by tensile testing that measures Young's modulus, yield strength, and ultimate tensile strength. The mechanical strength of the low dielectric material can also be determined by nanoindentation techniques and by stud pull techniques. As used herein, the phrase "stud pull techniques" means those techniques that are used to determine the pull strength, or force, needed to rupture the dielectric material 100. In preferred embodiments, a stud pull test is performed using a Sebastian Five stud pull tester manufactured by Quad group.

It is contemplated that the dielectric constant of the final dielectric material 100 will be decreased substantially from the original dielectric constant of the blending material 130. As used herein, the phrases "decreased substantially", "decrease of a substantial amount", and "decreased" means a decrease in the dielectric constant of the blending material 130 of at least 10%. In preferred embodiments, the dielectric constant of the final dielectric material 100 will be decreased by at least 20%. In more preferred embodiments, the dielectric constant of the final dielectric material 100 will be decreased by at least 30%.

Figure 6:
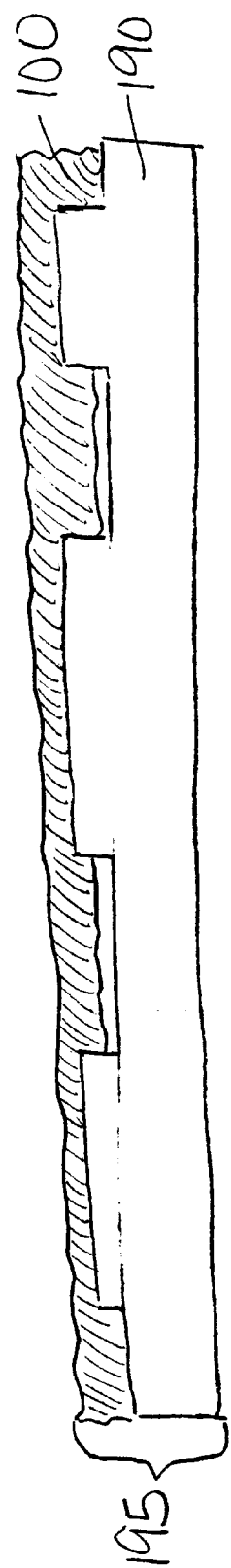
FIG. 6 is a cross-sectional view of a preferred embodiment of a modified electronic component.

As shown in FIG. 6, a preferred electronic component 195 can thus be formed by a) providing an electronic component 190; b) forming a film that comprises the amalgamation layer 150 on at least a portion of the electronic component 190; and c) treating the electronic component 190 to remove a substantial amount of the volatile component, thereby increasing the mechanical strength of the amalgamation layer 150 and significantly decreasing the dielectric constant of the dielectric material 100. It is contemplated that the electronic component 195 may also be formed by any other suitable methods or appropriate machinery.

The components 190 may be virtually anything, from precursors to adhesives and cements, to packaged chipsets. The component 190 may well comprise a prototype, at any stage of development from conceptual model to final scale-up mock-up. A prototype may or may not contain all of the actual components intended in the final component, and a prototype may have some components that are constructed out of composite material in order to negate their initial effects on other components while being initially tested. Contemplated electronic components 190 can be circuit boards, resistors, inductors, capacitors, solder points and solder connectors, or mother boards.

It is contemplated that the amalgamation layer 150 can be deposited onto an electronic component 190 by any suitable method. Contemplated methods include spinning the amalgamation layer 150 onto the electronic component 190, rolling the amalgamation layer 150 onto the electronic component 190, dripping the amalgamation layer 150 onto the electronic component 190, or pouring the amalgamation layer 150 onto the electronic component 190. In a preferred embodiment, the amalgamation layer 150 is rolled or spun onto the electronic component 190. It is contemplated that the amalgamation layer 150 can be deposited in any suitably sized or shaped deposit. Especially contemplated depositions are thin-film type deposits (<1 mm); however, other depositions including thick-film ($\geq 1$ mm), or stand-alone deposits are also contemplated.

The dielectric material 100 can be cured to its final form before or after any excess blending material 130 is removed from the amalgamation layer 150 or the dielectric material 100. Although in preferred embodiments the amalgamation layer 150 is cured into the dielectric material 100 using heat (for example: a) curing in an oven at 130° C. for 2 hours, b) baking on hot plates at 150/200/250° C. for one minute each and curing at 400° C. for 60 minutes, or c) baking to 150° C., 200° C. and 250° C. for one minute each and cured at 400° C. for 1 hour in flowing nitrogen) many other methods are contemplated, including catalyzed and uncatalyzed methods. Catalyzed methods may include general acid- and base catalysis, radical catalysis, cationic- and anionic catalysis, and photocatalysis. For example, a polymeric structure may be formed by UV-irradiation, addition of radical starters, such as ammoniumpersulfate, and addition of acid or base. Uncatalyzed methods include application of pressure, or application of heat at subatmospheric, atmospheric or super-atmospheric pressure.

EXAMPLES

Example 1

Aerogel thin films can be produced by the following method: a) spin coating a base catalyzed partially polymerized tetraethoxysilane solution in methanol on a silicon wafer, b) placing the wet wafer in a dish containing solvent so that the wafer remains submerged in the solvent, and c) performing a supercritical extraction at either the supercritical conditions of methanol or at the supercritical condition of liquid $CO_2$ after the solvent exchange of ethanol by liquid $CO_2$.

Example 2

FLARE™ nanoparticles can be prepared in a typical FLARE™ solution by the following method. Prepare a polymeric FLARE™ solution having a) high molecular weight fractions and b) low molecular weight fractions or oligomers or a linear polymeric additive. Apply a supercritical extraction process to the FLARE™ solution. During the supercritical extraction, the cross-linkable FLARE™ fractions will remain as a solid phase and will cross-link, but the oligomeric phase or the special additives will dissolve in the supercritical solvent while under appropriate pressure and temperature. Upon holding a high pressure and temperature, the polymeric phase will cross-link, but the oligomers or additives will come out with the vapor phase and thus will develop porosity in nanoscale as the porogens do on pyrolysis.

Example 3

Nanoporous, nanosized spheres of silica-based aerogels were produced by the supercritical extraction of the solvents from the dispersion of nanospheres in organic solvents to form supercritically dried powders of silica-based nanospheres. The nanoporous powders were dispersed in a low-dielectric organic polymer matrix, such as FLARE™. The coatings were deposited for the measurement of the dielectric constant. The dielectric constants of different coatings with silica content in the range of 12% to 23% by weight were measured. The dielectric constant of the polymer was 2.88. The dielectric constants of the composite films having different silica contents were in the range of 2.85 to 3.01. It should be noted that the silica aerogel is highly hygroscopic and the process used didn't include, at this time, any special measure for the removal of the hydroxyl groups and water.

Thus, specific embodiments and applications of low dielectric materials have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. A dielectric material comprising:

an amalgamation layer having a nanoporous aerogel and a blending material, said nanoporous aerogel having a plurality of pores and said blending material further comprising a reinforcing component and a volatile component.

2. The dielectric material of claim 1, wherein the nanoporous aerogel is a powder.

3. The dielectric material of claim 2, wherein the powder is subsequently cross-linked following an additional treating stage.

4. The dielectric material of claim 1, wherein the blending material has a dielectric constant no more than 3.0 prior to combining the blending material and the nanoporous aerogel.

5. The dielectric material of claim 1, wherein the pores have a sphere equivalent mean diameter of less than 100 nanometers.

6. The dielectric material of claim 1, wherein the pores have a sphere equivalent mean diameter of less than 10 nanometers.

7. The dielectric material of claim 1, wherein the reinforcing component substantially comprises a polymer.

8. The dielectric material of claim 7, wherein the polymer comprises poly(arylene ether).

9. The dielectric material of claim 1, wherein the volatile component is polar.

10. An electronic component comprising the dielectric material of claim 1.

11. The component of claim 10, wherein the dielectric material is a film.

12. The component of claim 10, wherein the component is a circuit chip.

\* \* \* \* \*